(12) United States Patent
Reinmuth et al.

(10) Patent No.: US 8,692,339 B2
(45) Date of Patent: Apr. 8, 2014

(54) MICROMECHANICAL COMPONENT HAVING A REAR VOLUME

(75) Inventors: Jochen Reinmuth, Reutlingen (DE); Michael Saettler, Kusterdingen (DE); Stefan Weiss, Tuebingen (DE); Arnim Hoechst, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 119 days.

(21) Appl. No.: 12/737,521

(22) PCT Filed: Jun. 3, 2009

(86) PCT No.: PCT/EP2009/056774
§ 371 (c)(1),
(2), (4) Date: Apr. 5, 2011

(87) PCT Pub. No.: WO2010/009934
PCT Pub. Date: Jan. 28, 2010

(65) Prior Publication Data
US 2011/0198713 A1   Aug. 18, 2011

(30) Foreign Application Priority Data

Jul. 22, 2008 (DE) .......................... 10 2008 040 597

(51) Int. Cl.
*H04R 17/00* (2006.01)
(52) U.S. Cl.
USPC ............. 257/416; 257/417; 73/754; 438/706; 438/719; 438/753; 438/735; 438/736; 438/738
(58) Field of Classification Search
USPC ............. 73/754; 257/416, 417, 415; 438/706, 438/719, 753, 735, 736, 737, 738
See application file for complete search history.

(56) References Cited

U.S. PATENT DOCUMENTS

| | | | | |
|---|---|---|---|---|
| 4,473,435 | A * | 9/1984 | Zafiropoulo et al. | 438/719 |
| 4,945,769 | A * | 8/1990 | Sidner et al. | 73/727 |
| 4,993,143 | A * | 2/1991 | Sidner et al. | 438/53 |
| 6,046,100 | A * | 4/2000 | Ramaswami et al. | 438/624 |
| 6,627,965 | B1 * | 9/2003 | Tuller et al. | 257/415 |
| 6,670,257 | B1 * | 12/2003 | Barlocchi et al. | 438/422 |
| 6,727,186 | B1 * | 4/2004 | Skotnicki et al. | 438/734 |
| 7,160,815 | B2 * | 1/2007 | Korzenski et al. | 438/753 |
| 7,294,536 | B2 * | 11/2007 | Villa et al. | 438/149 |

(Continued)

FOREIGN PATENT DOCUMENTS

| | | |
|---|---|---|
| CN | 101119924 | 2/2008 |
| DE | 10 2006 016 811 | 10/2007 |

(Continued)

OTHER PUBLICATIONS

Oliver Power et al.: "Anisotropic etching of (100) and (110) planes in (100) silicon," Journal of Micromechanics & Microengineering, Institute of Physics Publishing, Bristol, GB, Bd. 11, Nr. 3, May 1, 2001, pp. 217-220.

(Continued)

*Primary Examiner* — Michael Shingleton
(74) *Attorney, Agent, or Firm* — Kenyon & Kenyon LLP

(57) ABSTRACT

In a method for manufacturing a micromechanical component, a cavity is produced in the substrate from an opening at the rear of a monocrystalline semiconductor substrate. The etching process used for this purpose and the monocrystalline semiconductor substrate used are controlled in such a way that a largely rectangular cavity is formed.

10 Claims, 3 Drawing Sheets

(56) References Cited

U.S. PATENT DOCUMENTS

| | | | |
|---|---|---|---|
| 7,322,236 B2* | 1/2008 | Combi et al. | 73/488 |
| 7,439,093 B2* | 10/2008 | Beaudry | 438/48 |
| 7,786,014 B2* | 8/2010 | Neuilly et al. | 438/700 |
| 7,794,611 B2* | 9/2010 | Scurati | 216/2 |
| 7,906,321 B2* | 3/2011 | Mastromatteo et al. | 435/288.7 |
| 7,993,949 B2* | 8/2011 | Perruchot et al. | 438/50 |
| 8,008,738 B2* | 8/2011 | Villa et al. | 257/415 |
| 2002/0148807 A1* | 10/2002 | Zhao et al. | 216/2 |
| 2004/0217447 A1* | 11/2004 | D'arrigo Guiseppe et al. | 257/622 |
| 2004/0227207 A1* | 11/2004 | Barlocchi et al. | 257/510 |
| 2006/0057816 A1* | 3/2006 | Benzel et al. | 438/424 |
| 2006/0141794 A1* | 6/2006 | Laermer et al. | 438/706 |
| 2006/0292877 A1* | 12/2006 | Lake | 438/694 |
| 2007/0281493 A1* | 12/2007 | Fucsko et al. | 438/739 |
| 2008/0224242 A1* | 9/2008 | Villa et al. | 257/419 |
| 2008/0229840 A1* | 9/2008 | Shirasaka et al. | 73/754 |
| 2009/0269931 A1* | 10/2009 | Neuilly et al. | 438/700 |
| 2010/0269595 A1* | 10/2010 | Villa et al. | 73/718 |
| 2011/0024771 A1* | 2/2011 | Hajj-Hassan et al. | 257/84 |
| 2011/0049092 A1* | 3/2011 | Pan et al. | 216/27 |
| 2011/0198713 A1* | 8/2011 | Reinmuth et al. | 257/416 |
| 2011/0260298 A1* | 10/2011 | Lee et al. | 257/622 |

FOREIGN PATENT DOCUMENTS

| | | |
|---|---|---|
| DE | 10 2007 026 450 | 12/2008 |
| EP | 1 043 770 | 10/2000 |
| EP | 1 881 737 | 1/2008 |
| WO | WO 2007/112743 | 10/2007 |
| WO | WO 2007/115914 | 10/2007 |

OTHER PUBLICATIONS

Höchst Arnim et al.: "Investigations on the mechanism of Silicon etching with chlorine-trifluoride," Journal of Vacuum Science and Technology: Part B, AVS/AIP, Melville, New York, NY, US, Bd. 23, Nr. 5, Aug. 16, 2005, pp. 1936-1942.

* cited by examiner

MICROMECHANICAL COMPONENT HAVING A REAR VOLUME

BACKGROUND OF THE INVENTION

1. Field of the Invention

The present invention relates to a micromechanical component as well as to a method for the manufacture thereof.

2. Description of Related Art

Micromechanical sensors frequently use diaphragms which are situated over a cavity. In certain sensors, such as MEMS microphones, the size and shape of this cavity influence the resolution capability of the sensors.

However, not only a MEMS microphone but also a diaphragm sensor is usually implemented, with the aid of a two-step process. A sensor element 120, which includes, for example, a diaphragm and a counter-electrode 130, is placed on a semiconductor substrate 100. As illustrated in FIG. 1a, a cavity 110 which extends to the active sensor structure, i.e., in the case of a microphone, for example to counter-electrode 130, is subsequently introduced into the substrate from rear 170 of semiconductor substrate 100. Cavity 110 may be formed with the aid of a single trench etching process. However, it is necessary for the etch front to very accurately meet the active sensor structure, since a mechanical/acoustic short-circuit could otherwise occur if the cavity opening is offset in relation to the sensor structure. On the other hand, if the cavity opening is designed to be too small in relation to the size of the sensor structure, the sensor structure, for example a diaphragm, is unnecessarily dampened.

In general, a minimum volume must be maintained for the opening beneath the sensor structure, in particular when using a MEMS microphone, to ensure adequate sensitivity. To increase the sensitivity, however, it is desirable to make this volume as large as possible. On the other hand, however, the volume may not be enlarged to any size, since the surface at rear 170 of the component is used to mount the component on p.c. boards or in housings during further processing. A compromise must therefore be found between a large rear volume and an adequately large attachment surface on the rear of the substrate.

FIG. 1b shows a further known example for increasing the rear volume. Compared to the component according to FIG. 1a, a two-phase trench etching process is used in this case. During this procedure, a first trench etching process is used to introduce a cavity 140, having a larger opening compared to active sensor structure 130, into substrate 100. In a subsequent, second trench etching step, a smaller cavity 150 is produced, which is adapted to the dimensions of sensor element 120 or sensor structure 130. Although this process makes it possible to achieve a larger rear volume, including cavities 140 and 150, and thus an increase in sensitivity, the complexity associated with the two separate structuring steps is much higher compared to the component in FIG. 1a. It is also not possible to increase the size of cavity 140 by any amount, since an adequate attachment surface must be provided at rear 170 of substrate 100.

A method which produces a component according to FIG. 1c resolves the dilemma between an increased rear volume and an adequate attachment surface. A ring structure 160 is etched into substrate 100 beneath sensor element 120 or active sensor structure 130, using a combination of anisotropic and isotropic etching steps. This method makes it possible to increase the volume, while maintaining an attachment surface of the same size, compared to FIG. 1a. Due to the ring structure, however, the volume increase thus obtained with regard to the component in FIG. 1a is much smaller than that of the component according to FIG. 1b, maintaining the same thickness of substrate 100.

A method is known from published German patent application document DE 10 2007 026450 A1, in which a side extension of a cavity, may be produced in a semiconductor substrate, using a special trench process.

BRIEF SUMMARY OF THE INVENTION

The present invention provides a micromechanical component and a method for manufacturing a component of this type, in which a cavity is produced in the substrate, starting from an opening in the rear of a monocrystalline semiconductor substrate. The process used for this purpose, in connection with the monocrystalline semiconductor substrate used, is controlled in such a way that a largely rectangular cavity is formed.

It is provided to implement the cavity in rectangular form in the lateral and/or vertical direction(s).

In one embodiment of the present invention, a sensor element is placed on the front of the semiconductor substrate. To connect the cavity to the sensor element, i.e., to provide media access to the sensor element, an opening is provided in the front of the semiconductor substrate, starting from the cavity.

In a refinement of the present invention, a microphone is provided as the sensor element, in which a media exchange is required between the cavity and the area between the diaphragm and the counter-electrode in the form of pressure compensation. It may be advantageously provided that the counter-electrode is structured directly into the front of the semiconductor substrate, and the diaphragm is placed on the semiconductor substrate as an additional component.

If a monocrystalline semiconductor substrate is used, the walls are advantageously oriented in the corresponding crystal directions. Thus in the case of a (100) crystal, for example, a formation of walls in the <110> direction is observed, while the transitions between the walls run in the <100> direction. These transitions are more or less rounded due to the reduced etching rate in these crystal directions.

Due to the design according to the present invention of the rectangular cavity beneath the diaphragm or the counter-electrode, a larger volume may be implemented in the semiconductor substrate than is possible using an oval design. This makes it possible to accommodate more media. This also makes it possible to increase the sensitivity of the sensor element. Furthermore, it is thus possible to manufacture thinner and smaller sensor elements, in particular microphones.

DETAILED DESCRIPTION OF THE INVENTION

In the method for manufacturing the component according to the present invention, a sensor element 220 is first placed on a monocrystalline semiconductor substrate 200. The component may be both a common micromechanical diaphragm sensor and a micromechanically manufactured microphone. The diaphragm or the counter-element or counter-electrode 230 may be placed directly on the substrate. As an alternative, however, it is also possible to place sensor element 220 on front 310 of substrate 200 in such a way that a greater or lesser distance is provided between the diaphragm or counter-element and the substrate to avoid direct contact and thus damage during manufacture.

Figure 1A:
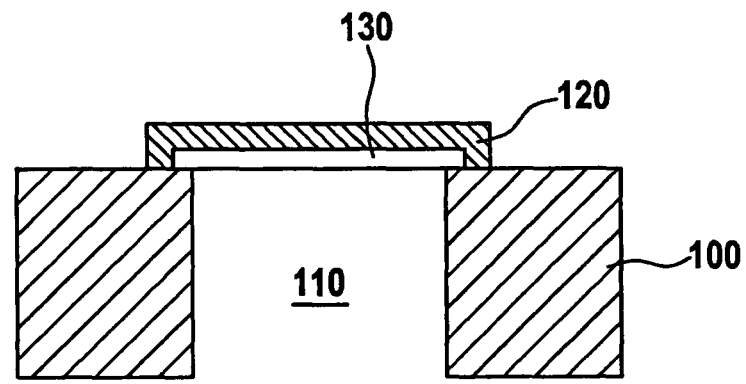
FIGS. 1a through 1c show embodiments of cavities which are known from the related art.
Figure 1B:
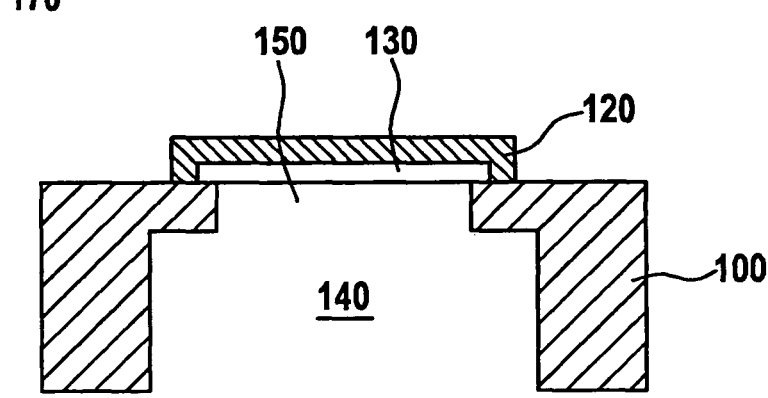
Figure 1C:
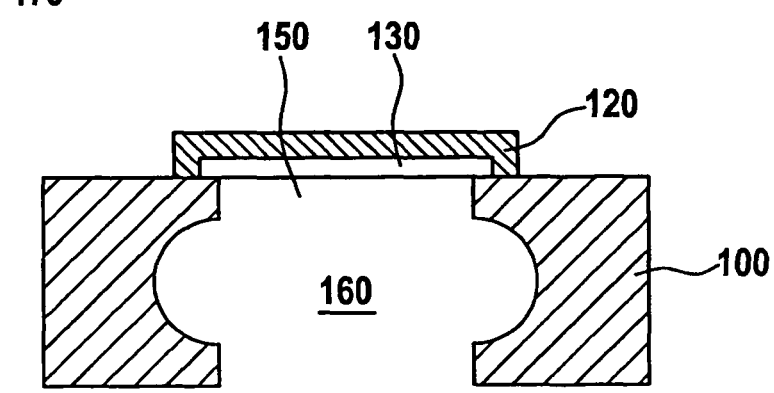
Figure 2A:
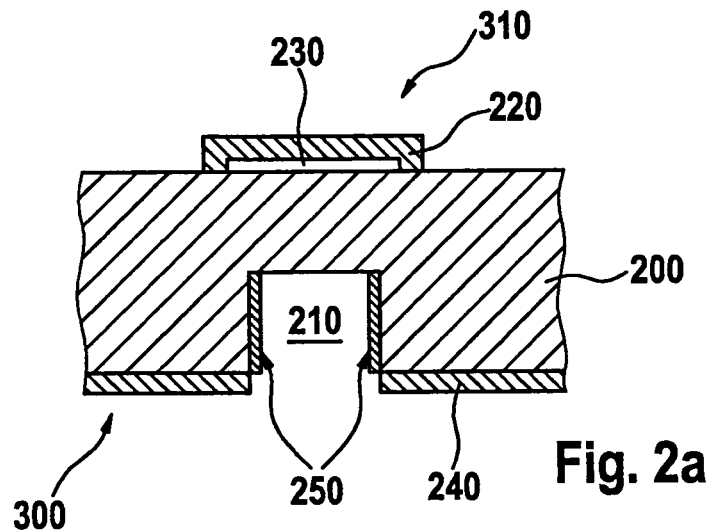
FIGS. 2a through 2d show the manufacture of the rectangular cavity.

A mask 240, which defines later cavity 210, is subsequently applied to the rear of substrate 200 according to a common micromechanical trench etching process. As shown in FIG. 2a, an approximately vertical indentation, which forms cavity 210, is anisotropically introduced into substrate 200 in the following trench etching process. A passivation layer 250 builds up on the side wall of the cavity. To achieve a particularly high rear volume, the trench etching process should be carried out up to approximately half the thickness of substrate 200.

Figure 2B:
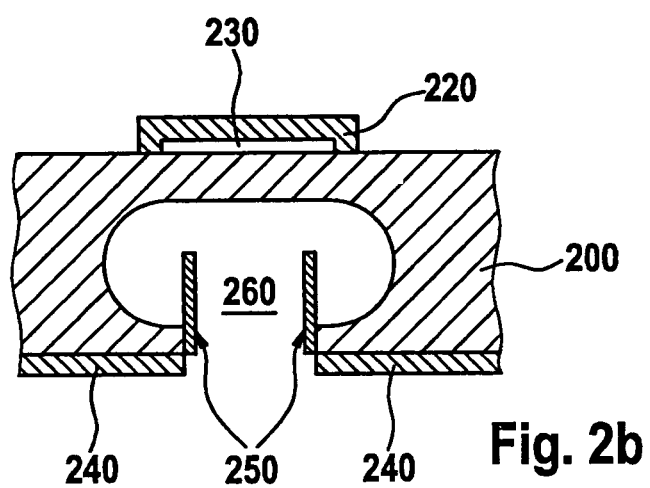

In a further etching step according to FIG. 2b, a ring 260 may be optionally introduced into the depth of the substrate, starting from cavity 210, using an isotropic etching step, e.g., with the aid of $SF_6$ etching. This optional step shortens the manufacturing time, since the etching rate of $SF_6$ etching is higher than that of the subsequent etching step.

Figure 2C:
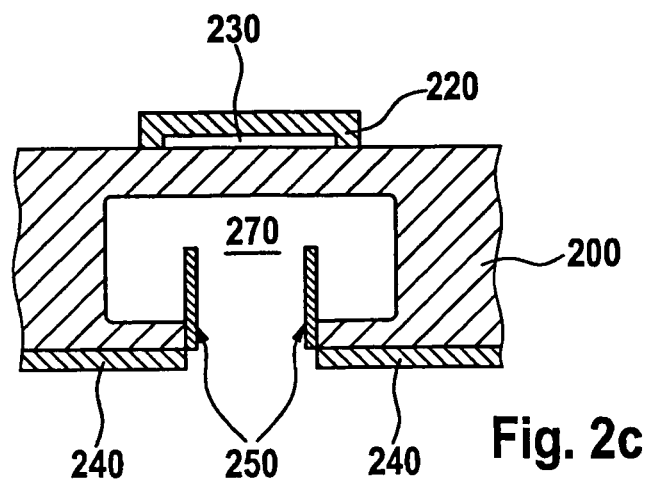

The important change over the related art lies in the fact that an etching step is used which takes into account the crystal orientation of the substrate. An etching process using $ClF_3$, $XeF_2$ or another anisotropically etching gas has proven to be advantageous. In this etching process, the etch fronts in the different crystal directions differ in such a way that they produce an approximately rectangular cavity 270 in substrate 200, as shown in FIG. 2c. The size of cavity 270, i.e., the lateral extension of cavity 270 in substrate 200, may be determined via the etching time. Thus, it is possible to produce a cavity which extends laterally in relation to sensor element 220 or the diaphragm or counter-electrode 230 and which has the same depth on all sides.

In the final etching step, an (anisotropic) trench etching process is used to open cavity 270 to sensor element 220 or to the diaphragm or to counter-electrode 230 through opening 215 produced in the first trench etching process. As described above, the size of produced opening 280 must be matched to sensor element 220, i.e., the diaphragm or counter-electrode 230.

If necessary, etching mask 240 as well as passivation layer 250 may also be removed in a further step before the component is separated.

Figure 2D:
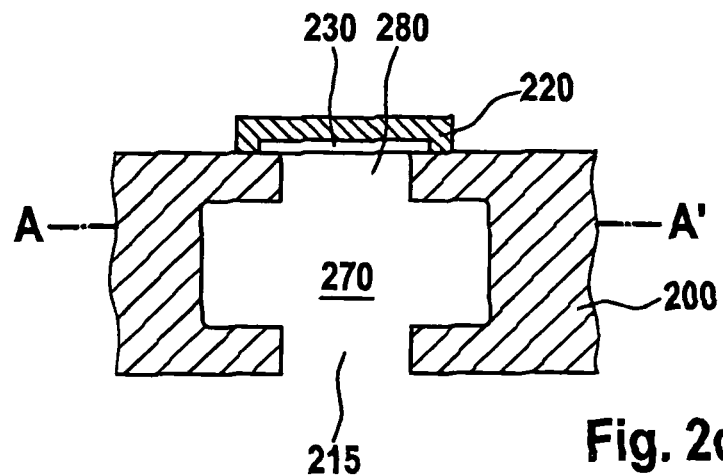
Figure 3:
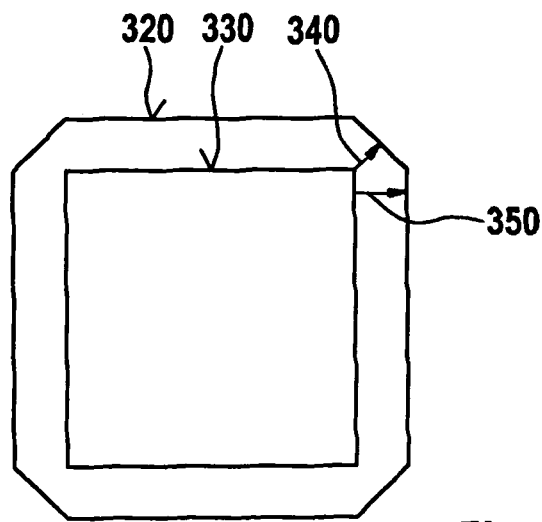
FIG. 3 shows a cross-section of the cavity according to the present invention.

In the cross-sectional view of the component according to FIG. 2d, the effect of the different extensions of the etch fronts is illustrated on the basis of the crystal orientations in a monocrystalline semiconductor substrate. In a (100) Si substrate, for example, the etching rate is less in <100> direction 340 than in <110> direction 350, for which reason walls 320 of cavity 270 are oriented in a nearly rectangular or square manner. As is also apparent on the basis of FIG. 3, the anisotropic etching process also acts upon mask opening 215 by producing a rectangular or square etch front 330 there as well.

Figure 4:
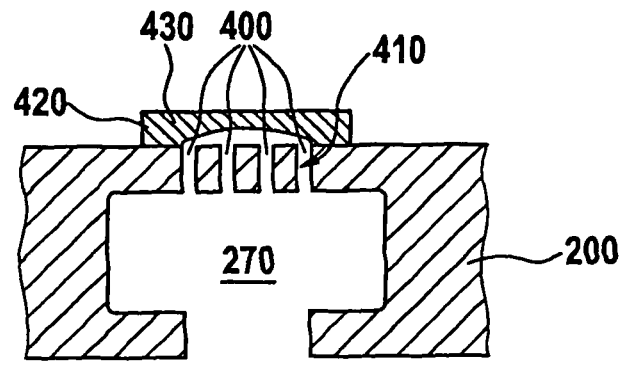
FIG. 4 shows an exemplary embodiment in the form of a microphone which is partially integrated into the semiconductor substrate.

According to a further exemplary embodiment, it is also possible to produce multiple smaller openings 400 instead of a single opening 280 as through openings to sensor element 420, as shown in FIG. 4. It may also be provided that counter-electrode 410 is introduced directly into the front of substrate 200. If necessary, additional doping of this region may also be carried out. The advantage of this exemplary embodiment lies in the fact that, instead of requiring the entire MEMS microphone to be placed on substrate 200, only sensor element 420 provided with diaphragm 430 needs to be placed thereon.

Furthermore, it is conceivable to integrate the sensor element entirely into the substrate.

What is claimed is:

1. A micromechanical component, comprising:
   a monocrystalline semiconductor substrate having a cavity, wherein an opening to the cavity is provided in the rear of the semiconductor substrate, the cavity having a depth which extends beyond the extension of the opening in the lateral direction and having an approximately rectangular shape; and
   a micromechanical sensor element having a diaphragm structure, wherein the diaphragm structure is in contact with the cavity via at least one opening in the front of the semiconductor substrate;
   wherein the lateral extension of the cavity is larger than the lateral extension of the diaphragm structure.

2. The micromechanical component as recited in claim 1, wherein the cavity has an approximately rectangular shape in at least one of the lateral direction and vertical direction.

3. The micromechanical component as recited in claim 1, wherein the sensor element has a microphone structure including the diaphragm and a counter-electrode, and wherein the counter-electrode is provided with at least one opening.

4. The micromechanical component as recited in claim 3, wherein at least one of the diaphragm and the counter-electrode is at least partially integrated into the front of the semiconductor substrate, and wherein the counter-electrode of the microphone structure is structured from the semiconductor substrate.

5. The micromechanical component as recited in claim 3, wherein the walls of the cavity are oriented toward the crystal directions of the monocrystalline semiconductor substrate, wherein the substrate has a (100) orientation, and wherein one of: (i) the walls of the cavity are oriented in the direction of the semiconductor substrate, or (ii) the transitions between the walls of the cavity are oriented in directions.

6. A method for producing a micromechanical component having a monocrystalline semiconductor substrate, the method comprising the following steps starting from the rear of the monocrystalline semiconductor substrate:
   carrying out a first anisotropic trench etching process for producing a cavity in the semiconductor substrate; and
   carrying out an anisotropic gas phase etching step using one of $ClF_3$ or $XeF_2$, for producing an approximately rectangular cavity in the semiconductor substrate, the cavity having a depth which extends beyond the extension of the opening in the lateral direction; and
   providing a micromechanical sensor element having a diaphragm structure, wherein the diaphragm structure is in contact with the cavity via at least one opening in the front of the semiconductor substrate, wherein the lateral extension of the cavity is larger than the lateral extension of the diaphragm structure.

7. The method as recited in claim 6, wherein an isotropic etching step producing a side indentation of the cavity in the semiconductor substrate is carried out after the cavity is produced.

8. The method as recited in claim 7, wherein a second anisotropic trench etching process producing at least one opening in the front of the semiconductor substrate is carried out after the cavity is produced, and wherein the at least one opening in the front of the semiconductor substrate is configured to permit a media exchange between the cavity and the sensor element on the front of the semiconductor substrate.

9. The method as recited in claim 8, wherein the sensor element has a microphone structure including the diaphragm structure and a counter-electrode, and wherein the second trench etching process takes place in two steps, the first step producing the counter-electrode of the microphone structure on the front of the semiconductor substrate, and the second step producing through openings in the counter-electrode.

10. The method as recited in claim 9, wherein the cavity produced by the first trench etching process has a depth approximately half the depth of the semiconductor substrate.

* * * * *